United States Patent [19]

Suzuki

[11] Patent Number: 4,755,911
[45] Date of Patent: Jul. 5, 1988

[54] MULTILAYER PRINTED CIRCUIT BOARD

[75] Inventor: Hirosuke Suzuki, Tokorozawa, Japan

[73] Assignee: Junkosha Co., Ltd., Japan

[21] Appl. No.: 43,464

[22] Filed: Apr. 28, 1987

[51] Int. Cl.$^4$ .............................................. H05K 1/14
[52] U.S. Cl. .................................... 361/414; 174/68.5; 174/117 PC; 428/422; 428/901
[58] Field of Search ........... 361/414; 174/68.5, 110 F, 174/110 FC, 117 PC; 428/131, 140, 422, 901

[56] References Cited

U.S. PATENT DOCUMENTS

| | | | |
|---|---|---|---|
| 2,955,974 | 10/1960 | Aleen et al. | 174/117 PC |
| 3,244,795 | 4/1966 | Latimer | 174/117 PC X |
| 3,467,569 | 9/1969 | Weber et al. | 174/110 F |
| 3,486,961 | 12/1969 | Adams | 174/110 PC |
| 4,423,282 | 12/1983 | Suzuki et al. | 174/110 F X |
| 4,443,657 | 4/1984 | Hill et al. | 174/110 F X |
| 4,591,659 | 5/1986 | Leibowitz | 361/414 X |
| 4,640,866 | 2/1987 | Suzuki | 174/68.5 X |
| 4,680,220 | 7/1987 | Johnson | 174/209 X |
| 4,689,110 | 8/1987 | Leibowitz | 174/68.5 X |

OTHER PUBLICATIONS

The Journal of Teflon, Du Pont pamphlet, published at Wilminton, Del., pp. 1 to 12.

Primary Examiner—R. R. Kucia
Attorney, Agent, or Firm—Mortenson & Uebler

[57] ABSTRACT

A multilayer printed circuit board is provided comprising a plurality of printed circuit boards laminated together, each board being separated from an adjacent board by a layer of a dielectric of porous, expanded polytetrafluoroethylene (PTFE). The dielectric layer may have an adhesive on its surface(s) affixed as a layer or in a pattern of dots. Alternatively, an adhesive may be impregnated within the pores of the porous dielectric. In a preferred embodiment, the dielectric has additional openings or through holes in it, in additon to the pores of the porous dielectric.

7 Claims, 1 Drawing Sheet

MULTILAYER PRINTED CIRCUIT BOARD

BACKGROUND OF THE INVENTION

The present invention relates to printed-wiring boards or printed-circuit boards which are associated with high-speed electrical signals and with short signal transmission delay times. More specifically, due to the use of intermediate dielectric bodies in the multilayer printed-circuit board of this invention, the delay which occurs in transmission of such signals is shortened.

With the development of IC and LSI circuits, which find application in various electronic instruments, it has been common practice to use printed-circuit boards and multilayer printed-wiring boards. In the course of time, however, a demand has arisen for higher signal transmission speed through multilayer printed-circuit boards having intermediate dielectric components. Under such conditions, delay in transmission of signals has become a major problem.

It is an object of the present invention to provide a multilayer printed-circuit board in which the passage of signals through intermediate dielectric bodies does not cause significant delay in transmission of the signals.

SUMMARY OF THE INVENTION

A multilayer printed circuit board is provided comprising a plurality of individual printed circuit boards laminated together, each individual board being separated from an adjacent board by a layer of a dielectric of porous, expanded PTFE. The layer of dielectric may have an adhesive on at least one surface or on both surfaces. The adhesive may be in the form of a layer or in the form of discrete dots. The layer of dielectric may have an adhesive impregnated within its pores. The adhesive may be a fluororesin polymer. Preferably, at least one of the layers of dielectric has additional through holes, in addition to the pores of the porous dielectric.

DETAILED DESCRIPTION OF THE INVENTION AND PREFERRED EMBODIMENTS WITH REFERENCE TO THE DRAWINGS

A multilayer printed circuit board is provided comprising a plurality of printed circuit boards laminated together, each board being separated from an adjacent board by a layer of a dielectric of porous, expanded polytetrafluoroethylene (PTFE). The dielectric layer may have an adhesive on its surface(s) affixed as a layer or in a pattern of dots. Alternatively, an adhesive may be impregnated within the pores of the porous dielectric. In a preferred embodiment, the dielectric has additional openings or through holes in it, in addition to the pores of the porous dielectric.

According to the present invention, a multilayer printed circuit board is formed of several individual printed circuit boards with porous intermediate dielectric layers placed between the several individual printed circuit boards.

Because the above-mentioned porous intermediate dielectric layers are made of an expanded, porous PTFE, foamed porous tetrafluoroethylene resin, or a similar porous fluororesin, the printed circuit board has a very low dielectric constant. It has no significant increase in signal transmission delay time, and the intermediate layers impart to the board improved properties such as thermal and chemical stability.

Because the multilayer printed circuit boards of the present invention are provided with several porous intermediate dielectric layers placed between the several individual printed circuit boards, the multilayer board has a dielectric constant approximately that of a single board or lower. As a result, the transmission time of signals through the dielectric layers is not delayed significantly.

In addition, in accordance with the present invention, the multilayer printed circuit board can be provided with an adhesive layer, or with an adhesive agent, which is used for attachment of the porous intermediate layers to the individual printed circuit boards. The adhesive can be distributed in a dot-like pattern, particularly on the edge portions of the boards. The elements of a multilayer printed circuit board can be firmly attached to each other, without causing a delay in the signal transmission time as well as without causing a local increase in the dielectric constant in the areas adjacent to the locations of the circuits or wiring elements.

Figure 1:
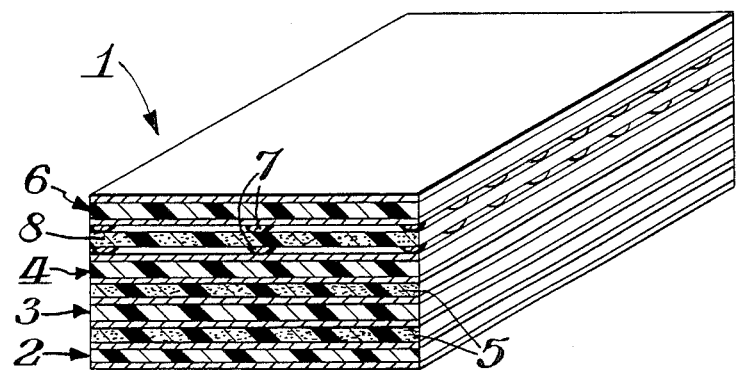
FIG. 1 is a perspective view, partly in cross-section, of a multilayer printed circuit board in accordance with one embodiment of the present invention.

FIG. 1 is a perspective view, partly in cross-section, illustrating the structure of a multilayer printed circuit board made in accordance with the present invention.

In this embodiment, a multilayer printed circuit board 1 comprises three separate printed circuit boards 2, 3 and 4, which are held firmly together as an integral unit by means of porous intermediate dielectric layers 5 impregnated with an adhesive composition. Printed circuit board 6 is attached to printed circuit board 4 through porous intermediate dielectric layer 8 having on its surfaces adhesive 7 distributed on its surfaces in a dot-like pattern.

Printed circuit boards 2, 3, 4 and 6 suitable for the purpose of the present invention may be comprised of fluororesin-type printed circuit boards disclosed in Japanese Patent Application Nos. 59-72,472; 59-83,308; and Utility Model Application No. 59-169,574. Porous intermediate dielectric layers 5 and 8 which are especially suitable for the same purpose may be comprised of an expanded, porous PTFE obtained by the method described in Japanese Patent Publication (Kokai) No. 51-18,991; and its U.S. counterpart, U.S. Pat. No. 3,593,566. The intermediate elements can be made of a foamed porous tetrafluoroethylene resin, or from other similar porous fluororesins.

Figure 2:
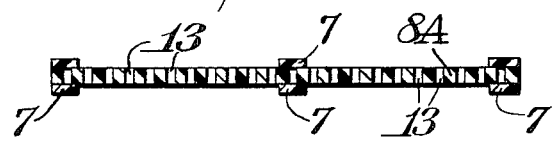
FIGS. 2-4 are side cross-sectional views of porous intermediate dielectric layers utilized in other embodiments of the invention.

FIG. 2 illustrates the porous intermediate dielectric layer 8 which is provided with adhesive composition 7. The adhesive composition is distributed on the edges of body 8 in a dot-like manner and is formed, for example, from a fluororesin-type adhesive agent available under the trademark "Lumiflon".

Because the adhesive composition is distributed in a dot-like pattern and is located only on the edge portions of the dielectric layer, the elements can be firmly integrated into a single unit with only a local increase in the value of the dielectric constant in the vicinity of the printed circuit or wiring elements.

Figure 3:
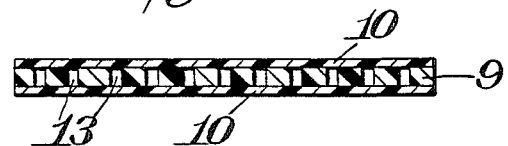
Figure 4:
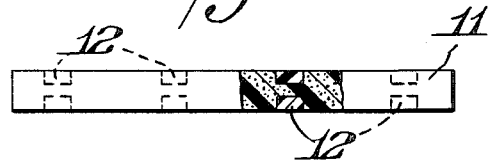

FIGS. 3 and 4 show other modifications of the porous dielectric layers suitable for the purpose of the present invention.

In the structure of a porous intermediate dielectric layer 9 shown in FIG. 3, entire surfaces on both sides of the layer are coated with adhesive layers 10. In a modification of a porous intermediate dielectric layer 11 shown in FIG. 4, a fluororesin-type adhesive agent 12 impregnates the edges of body 11 and is applied onto body 11 in a dot-like pattern. Printed circuit boards are brought into contact with dielectric body 11 and are attached by heating, which causes leaching and adhesion.

Additional through holes 13 are shown in the dielectric layers of FIGS. 2 and 3.

The present invention is not limited only to examples given above. For instance, the porous intermediate dielectric layer can be produced by impregnating the entire surface of a prepreg or film with an adhesive composition. Several units made of intermediate dielectric layers sandwiched between printed circuit boards can be connected to each other through insulating plates by means of bolts. According to another version, both surfaces of the porous intermediate dielectric layers can be coated with adhesive tapes or other forms of adhesive.

Because according to the present invention, several porous intermediate dielectric layers are sandwiched between several individual printed circuit boards, peripheries of the printed circuit boards are protected and supported by the porous intermediate dielectric layers having low dielectric constants. Thus, the effect of the invention resides in that it protects the units from significant delay in the transmission speed of signals and provides multilayer printed circuit boards suitable for high-speed transmission of signals.

The invention is especially efficient when the porous intermediate dielectric layers are made from expanded, porous PTFE or a similar porous fluororesin which is characterized by having a low dielectric constant, which provides favorable conditions for transmission of signals, and at the same time possesses stable chemical and physical properties. Due to these conditions, a highly reliable multilayer printed circuit board is obtained.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A multilayer printed circuit board comprising a plurality of individual printed circuit boards laminated together, each individual board being separated from an adjacent board by a layer of a dielectric of a porous fluororesin, wherein said layer of a dielectric has an adhesive on at least one surface in the form of discrete dots.

2. The multilayer printed circuit board of claim 1 wherein said porous fluororesin is porous poly-tetrafluoroethylene.

3. The multilayer printed circuit board of claim 1 wherein said porous fluororesin is porous, expanded PTFE.

4. The multilayer printed circuit board of claim 1 wherein said layer of a dielectric has an adhesive on both surfaces.

5. The multilayer printed circuit board of claim 1 wherein said layer of a dielectric has an adhesive impregnated within its pores.

6. The multilayer printed circuit board of claim 1 or 5 wherein said adhesive is a fluororesin polymer.

7. The multilayer printed circuit board of claim 1 wherein at least one of said layers of dielectric has additional through holes, in addition to the pores of said porous dielectric.

* * * * *